(12) United States Patent
Chellamuthu et al.

(10) Patent No.: US 7,236,003 B2
(45) Date of Patent: Jun. 26, 2007

(54) H-BRIDGE CIRCUIT WITH SHOOT THROUGH CURRENT PREVENTION DURING POWER-UP

(75) Inventors: Shanmuganand Chellamuthu, Richardson, TX (US); Brett E. Smith, McKinney, TX (US); Thomas A. Schmidt, Murphy, TX (US); Abidur Rahman, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 11/239,021

(22) Filed: Sep. 29, 2005

(65) Prior Publication Data

US 2007/0080708 A1 Apr. 12, 2007

(51) Int. Cl.
*H03K 19/007* (2006.01)
(52) U.S. Cl. .............................. 326/14; 326/27; 363/50
(58) Field of Classification Search .................. 326/14, 326/26, 27; 363/50, 58
See application file for complete search history.

(56) References Cited

U.S. PATENT DOCUMENTS

| | | | |
|---|---|---|---|
| 4,989,127 A * | 1/1991 | Wegener | 363/16 |
| 6,307,409 B1 * | 10/2001 | Wrathall | 327/112 |
| 6,728,084 B2 * | 4/2004 | Ziemer et al. | 361/33 |
| 6,909,620 B2 * | 6/2005 | Park et al. | 363/56.04 |

* cited by examiner

*Primary Examiner*—Don Le
(74) *Attorney, Agent, or Firm*—Alan K. Stewart; W. James Brady; Frederick J. Telecky, Jr.

(57) ABSTRACT

The H-bridge circuit with shoot through current prevention during power-up includes: a high side transistor; a low side transistor coupled in series with the high side transistor; pull down devices coupled to a control node of the high side transistor and to a control node of the low side transistor; and wherein the pull down devices are controlled by a pull down circuit including a Power On Reset circuit, monitoring the digital power supply such that the high side and low side transistors are OFF until the digital power supply has settled to a desired operating voltage.

13 Claims, 2 Drawing Sheets

H-BRIDGE CIRCUIT WITH SHOOT THROUGH CURRENT PREVENTION DURING POWER-UP

FIELD OF THE INVENTION

The present invention relates to electronic circuitry and, in particular, to an H-bridge circuit with shoot through current prevention during power-up.

BACKGROUND OF THE INVENTION

Initially, when power is applied to a full or half H-bridge circuit, before the digital logic settles to the correct state, both the high and low sides on a half H-bridge side can be ON at the same time. The chip can blow up because of excessive currents during this shoot-through event.

For integrated circuit chips that contain a Full or half H-bridge circuit, the digital power supply rails take time to settle during power up. During that time interval, which can be on the order of a few micro seconds, if the digital control signals to the high side and low side drive level shifters are not correct, both the high and low side FET's can both be ON at the same time. The chip can blow up because of excessive currents during this shoot-through event.

A typical prior art half H-bridge circuit is shown in FIG. 1. Transistor M0 is called the high side FET and its drain is connected to the main power supply Vdd. The gate of high side FET M0 is driven by high side level shifter 20 which is usually supplied by charge pump voltage. Transistor M1 is called a Low side FET and its source is connected to Ground. The gate of low side FET M1 is driven by low side level shifter 22. In normal operation, both the high and low sides are never ON at the same time.

Both the high and low side digital control signal inputs to the level shifters 20 and 22 are from a digital logic core 24. During power up, if the digital logic power supply (3.3 V—Digital Rail shown in FIG. 1) takes time to settle to its final value, the control signals could be in the wrong state instructing the level shifters 20 and 22 to turn ON both the high and low side FET's M0 and M1 at the same time. During this event called shoot-through, excessive currents flow between the main power supply Vdd and ground through the high and low side FET's M0 and M1. The chip potentially can blow up during shoot-through.

Two prior art architectures are shown in FIGS. 1 & 2. On the first architecture, shown in FIG. 1, there is no attempt to control the shoot through event. On the second architecture, shown in FIG. 2, there are passive devices (resistors) R1 and R2 placed from the gate node to ground. This potentially decreases shoot-through, but during normal operation when the FET's M0 and M1 are supposed to be ON, there is a leakage current to ground. On the high side, since the gate is driven by a chargepump voltage, the chargepump is unnecessarily strained.

SUMMARY OF THE INVENTION

An H-bridge circuit with shoot through current prevention during power-up includes: a high side transistor; a low side transistor coupled in series with the high side transistor; a pull down device coupled to a control node of the high side transistor and to a control node of the low side transistor; and wherein the pull down device is controlled by a POR(Power On Reset) circuit monitoring the digital power supply such that the high side and low side transistors are OFF until the digital power supply has settled to a desired operating voltage.

DETAILED DESCRIPTION OF PREFERRED EMBODIMENTS

Figure 1:
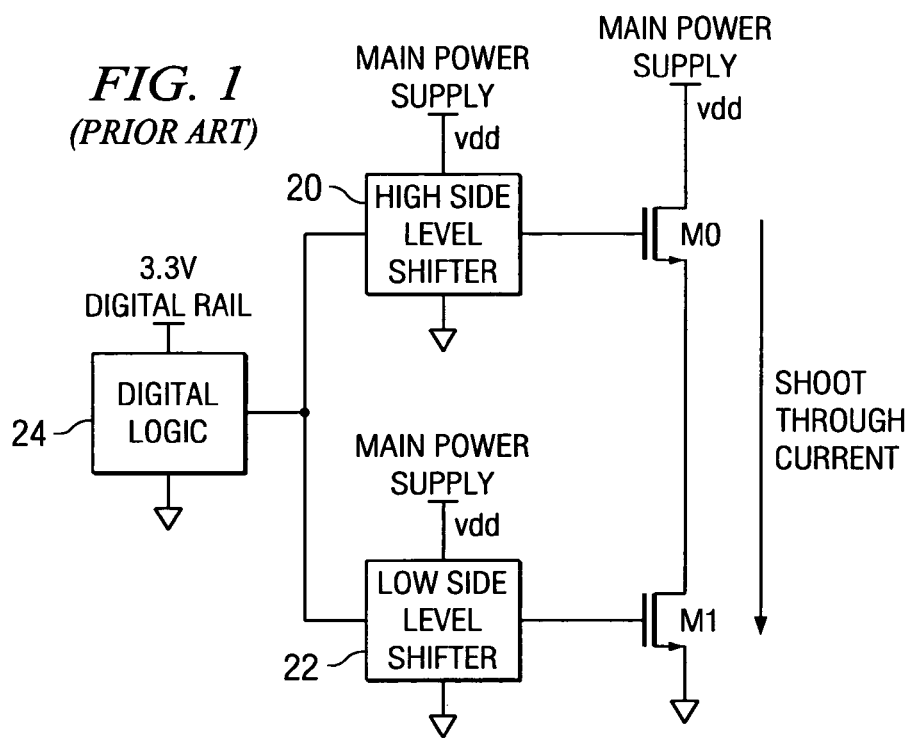
FIG. 1 is a circuit diagram of a typical prior art half H-bridge circuit.
Figure 2:
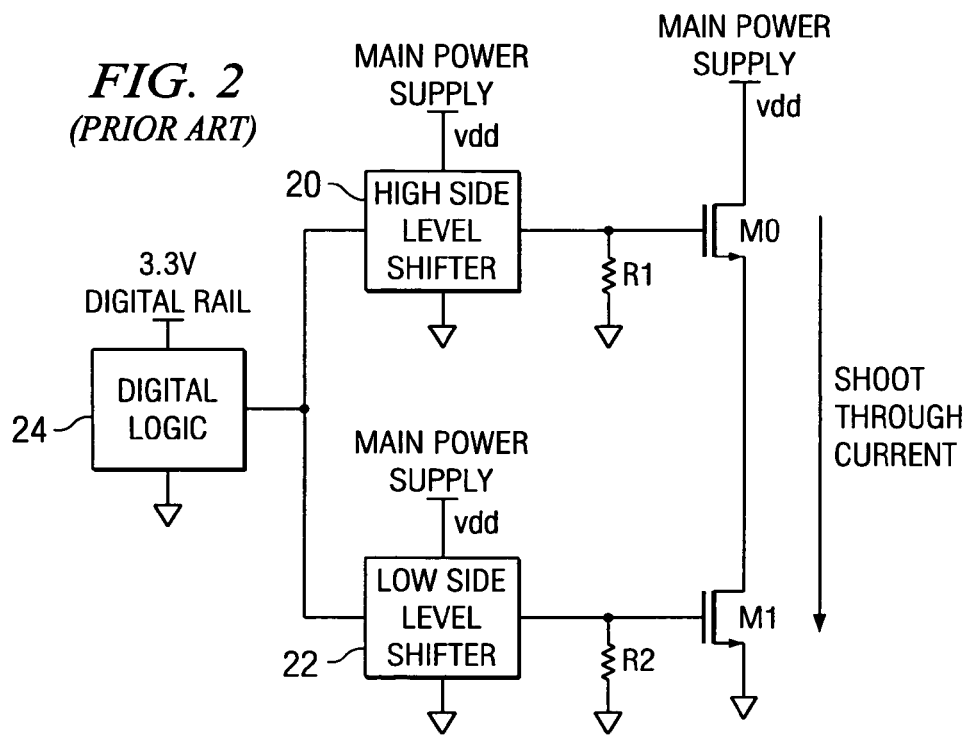
FIG. 2 is a circuit diagram of a typical prior art half H-bridge circuit with a prior art passive shoot through current prevention device.
Figure 3:
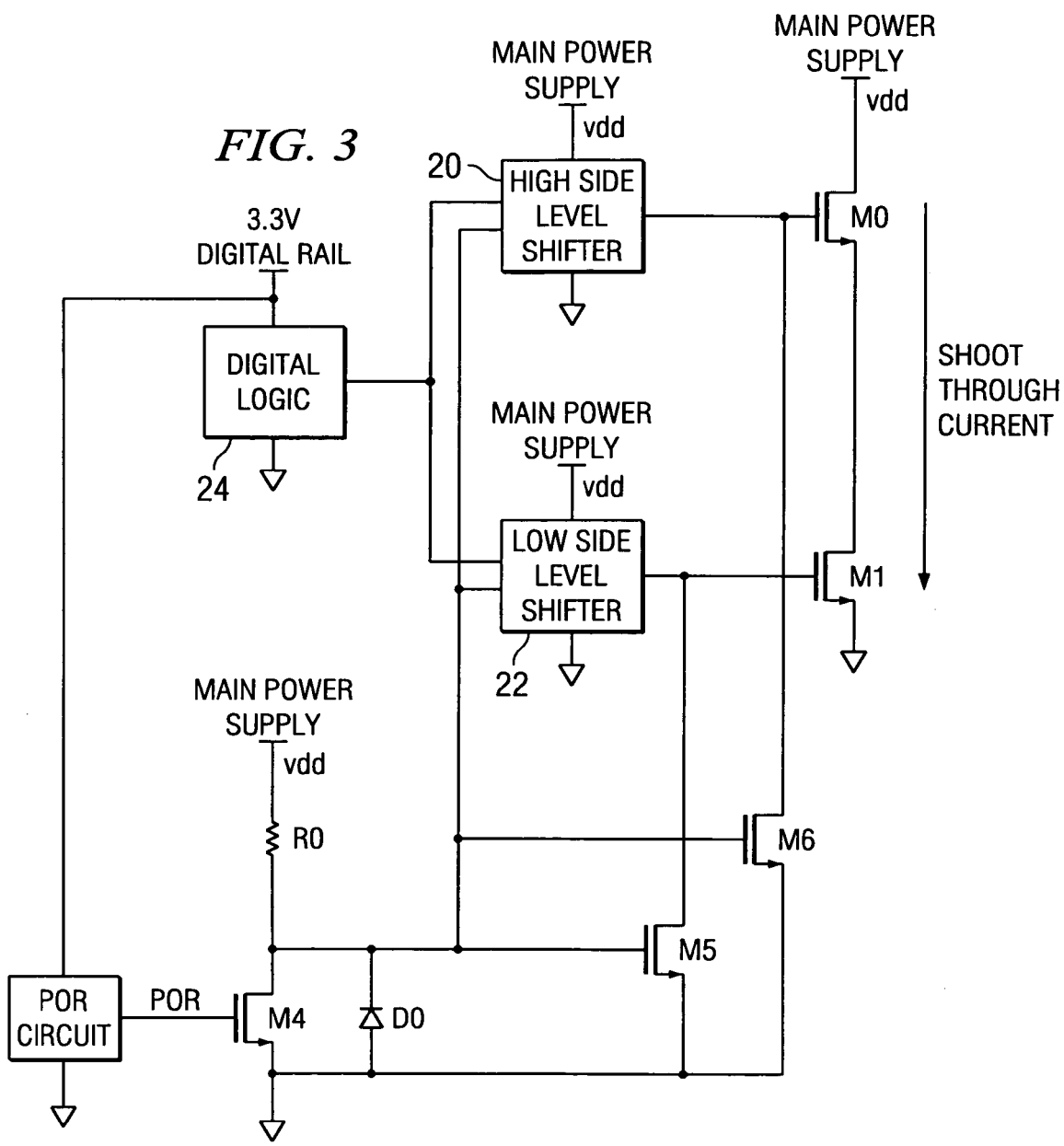
FIG. 3 is a circuit diagram of a preferred embodiment half H-bridge circuit with shoot through current prevention during power-up.

A preferred embodiment half H-bridge circuit with shoot through current prevention during power-up is shown in FIG. 3. In addition to the circuitry shown in FIG. 1, the circuit of FIG. 3 includes Power On Reset (POR) circuit; resistor R0; transistors M4, M5, and M6; and diode D0. Most integrated circuits have a POR circuit. The function of a POR circuit is to issue an active high voltage signal called POR. This signal goes high only when the power supply voltage rail has settled (in this case the digital logic core 3.3V digital rail). The POR signal verifies that the digital rails and logic has settled.

Until node POR goes high, the drain of FET M4 tracks the main power supply ramp (as long as it is not diode clamped—for gate oxide protection). This not only actively pulls down the gates of the low and high side transistors M0 and M1, it also sets the level shifters 20 and 22 in the right state and thereby avoids current being drawn because the gates of Hbridge output transistors M0 and M1 are pulled down. By this architecture the control signals are in the right state and the active pull downs don't have to fight the level shifters 20 and 22.

After the POR voltage signal goes high, the drain of transistor M4 goes low and this whole scheme is out of the circuit and normal operation can begin. Then, the settled digital logic controls the Hbridge high and low side FET's M0 and M1, and thus the shoot-through current on the Hbridge is avoided. Another advantage of this scheme is that this signal (drain voltage of transistor M4) can be used universally within the chip for several other H-bridges and level shifters within the chip.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   a high side transistor;
   a low side transistor coupled in series with the high side transistor;
   a pull down device coupled to a control node of the high side transistor and to a control node of the low side transistor; and
   a Power On Reset circuit for monitoring a digital power supply and for controlling the pull down device such that the high side and low side transistors are OFF until the digital power supply has settled to a desired operating voltage.

2. The circuit of claim 1 wherein the pull down device comprises:
   a first pull down transistor coupled to the control node of the high side transistor; and
   a second pull down transistor coupled to the control node of the low side transistor.

3. The circuit of claim 2 wherein the pull down device further comprises a Power On Reset circuit controlled by the digital power supply for outputting a Power On Reset signal for controlling the first and second pull down transistors.

4. The circuit of claim 3 further comprising a transistor device coupled to a control node of the first pull down transistor and to a control node of the second pull down transistor, and having a control node coupled to the Power On Reset circuit.

5. The circuit of claim 4 further comprising a resistor coupled between the transistor device and a main power supply node.

6. The circuit of claim 1 further comprising a high side level shifter coupled to the control node of the high side transistor and powered by a main power supply node.

7. The circuit of claim 1 further comprising a low side level shifter coupled to the control node of the low side transistor and powered by a main power supply node.

8. The circuit of claim 6 further comprising a low side level shifter coupled to the control node of the low side transistor and powered by the main power supply node.

9. The circuit of claim 8 further comprising a digital logic circuit having an output coupled to an input of the high side level shifter and to an input of the low side level shifter, and powered by the digital power supply.

10. A circuit comprising:
    a high side transistor coupled to a main power supply;
    a low side transistor coupled in series with the high side transistor;
    a high side level shifter having an output coupled to a control node of the high side transistor and powered by the main power supply;
    a low side level shifter having an output coupled to a control node of the low side transistor and powered by the main power supply;
    a pull down device coupled to the control node of the high side transistor and to the control node of the low side transistor;
    a digital logic circuit having an output coupled to an input of the high side level shifter and to an input of the low side level shifter, and powered by a digital power supply; and
    a Power On Reset circuit for monitoring the digital power supply and for controlling the pull down device such that the high side and low side transistors are OFF until the digital power supply has settled to a desired operating voltage.

11. The circuit of claim 10 wherein the pull down device comprises:
    a first pull down transistor coupled to the control node of the high side transistor; and
    a second pull down transistor coupled to the control node of the low side transistor.

12. The circuit of claim 11 further comprising a transistor device coupled to a control node of the first pull down transistor and to a control node of the second pull down transistor, and having a control node coupled to the Power On Reset circuit.

13. The circuit of claim 12 further comprising a resistor coupled between the transistor device and the main power supply.

* * * * *